(12) United States Patent
Vovos et al.

(10) Patent No.: US 10,305,407 B2
(45) Date of Patent: May 28, 2019

(54) MACHINE LOSS MODELING FOR IMPROVED FIELD ORIENTED CONTROL ACCURACY

(71) Applicant: BAE Systems Information and Electronic Systems Integration Inc., Nashua, NH (US)

(72) Inventors: Robert J. Vovos, Vestal, NY (US); Arthur P. Lyons, Maine, NY (US)

(73) Assignee: BAE Systems Controls Inc., Endicott, NY (US)

( * ) Notice: Subject to any disclaimer, the term of this patent is extended or adjusted under 35 U.S.C. 154(b) by 194 days.

(21) Appl. No.: 14/888,258

(22) PCT Filed: Feb. 26, 2015

(86) PCT No.: PCT/US2015/017639
§ 371 (c)(1),
(2) Date: Oct. 30, 2015

(87) PCT Pub. No.: WO2015/130876
PCT Pub. Date: Sep. 3, 2015

(65) Prior Publication Data
US 2016/0111994 A1    Apr. 21, 2016

Related U.S. Application Data

(60) Provisional application No. 61/946,561, filed on Feb. 28, 2014.

(51) Int. Cl.
*H02P 23/00* (2016.01)
*H02P 27/08* (2006.01)
(Continued)

(52) U.S. Cl.
CPC .......... *H02P 23/0004* (2013.01); *G05B 17/02* (2013.01); *H02P 21/09* (2016.02);
(Continued)

(58) Field of Classification Search
CPC ... H02P 21/0089; H02P 2207/03; B60K 1/02; B60K 6/26; B60K 6/48
(Continued)

(56) References Cited

U.S. PATENT DOCUMENTS 3,320,507 A * 5/1967 Ford, Jr. ................. H02P 7/293
                                                        318/269
5,334,923 A * 8/1994 Lorenz ................... H02P 6/187
                                                        318/805
(Continued)

FOREIGN PATENT DOCUMENTS

JP    2008-059362    3/2008
JP    2012-130160    7/2012

OTHER PUBLICATIONS

Wang, A. and Ling, Z, Realization of Vector Control for Induction Motor Considering Iron Loss, Second International Symposium on intelligent Information Technology Application, Shanghai China, Dec. 21-22, 2008. IEEE, Piscataway, NJ, USA, Dec. 20, 2008 (Dec. 20, 2008) pp. 761-765, ISBN: 978-0-7695-3497-8/08.*

(Continued)

*Primary Examiner* — Kawing Chan
*Assistant Examiner* — Bradley R Brown
(74) *Attorney, Agent, or Firm* — Scully Scott Murphy & Presser PC

(57) ABSTRACT

Controllers, method and programs for controlling machines are provided. For example, A method comprises determining a resistance value for a loss compensation resistor, updating at least one control equation based on an equivalent circuit using the resistance value and controlling the machine based on the updated at least one control equation. The resistance value represents a plurality of electro-magnetic losses of a machine. The resistance value can be determined from an inverse resistance value.

10 Claims, 13 Drawing Sheets

(51) Int. Cl.
*H02P 23/14* (2006.01)
*G05B 17/02* (2006.01)
*H02P 21/14* (2016.01)
*H02P 21/16* (2016.01)
*H02P 21/09* (2016.01)
*G01R 31/34* (2006.01)

(52) U.S. Cl.
CPC ............ *H02P 21/141* (2013.01); *H02P 21/16* (2016.02); *H02P 23/14* (2013.01); *H02P 27/08* (2013.01); *G01R 31/343* (2013.01)

(58) Field of Classification Search
USPC ........................................................ 318/494
See application file for complete search history.

(56) References Cited

U.S. PATENT DOCUMENTS

| | | | | |
|---|---|---|---|---|
| 5,594,670 | A * | 1/1997 | Yamamoto | G01R 31/343 318/767 |
| 6,011,992 | A | 1/2000 | Hubbard et al. | |
| 8,339,082 | B2 * | 12/2012 | Campbell | H02P 21/16 318/432 |
| 2006/0290312 | A1 * | 12/2006 | Nagai | H02P 25/024 318/599 |
| 2007/0118307 | A1 * | 5/2007 | El-Ibiary | H02P 23/14 702/60 |
| 2009/0001922 | A1 | 1/2009 | Hasegawa et al. | |
| 2013/0221885 | A1 * | 8/2013 | Hunter | H02P 21/0003 318/400.15 |

OTHER PUBLICATIONS

ISA, PCT/US2015/017700, May 29, 2015.
PCT/US2015/017639 International Search Report dated Jun. 8, 2015.
Wang, A. and Ling, Z., Realization of Vector Control for Induction Motor Considering Iron Loss, Second International Symposium on Intelligent Information Technology Application, Shanghai, China, Dec. 21-22, 2008. pp. 761-765.
Hrkel, M. et al., Maximum Torque per Ampere Control Strategy of Induction Motor with Iron Losses, IEEE, May 21, 2012. pp. 185-190.
European Search Report, EP 15755832.1, dated Oct. 11, 2017. 11 pages.

* cited by examiner

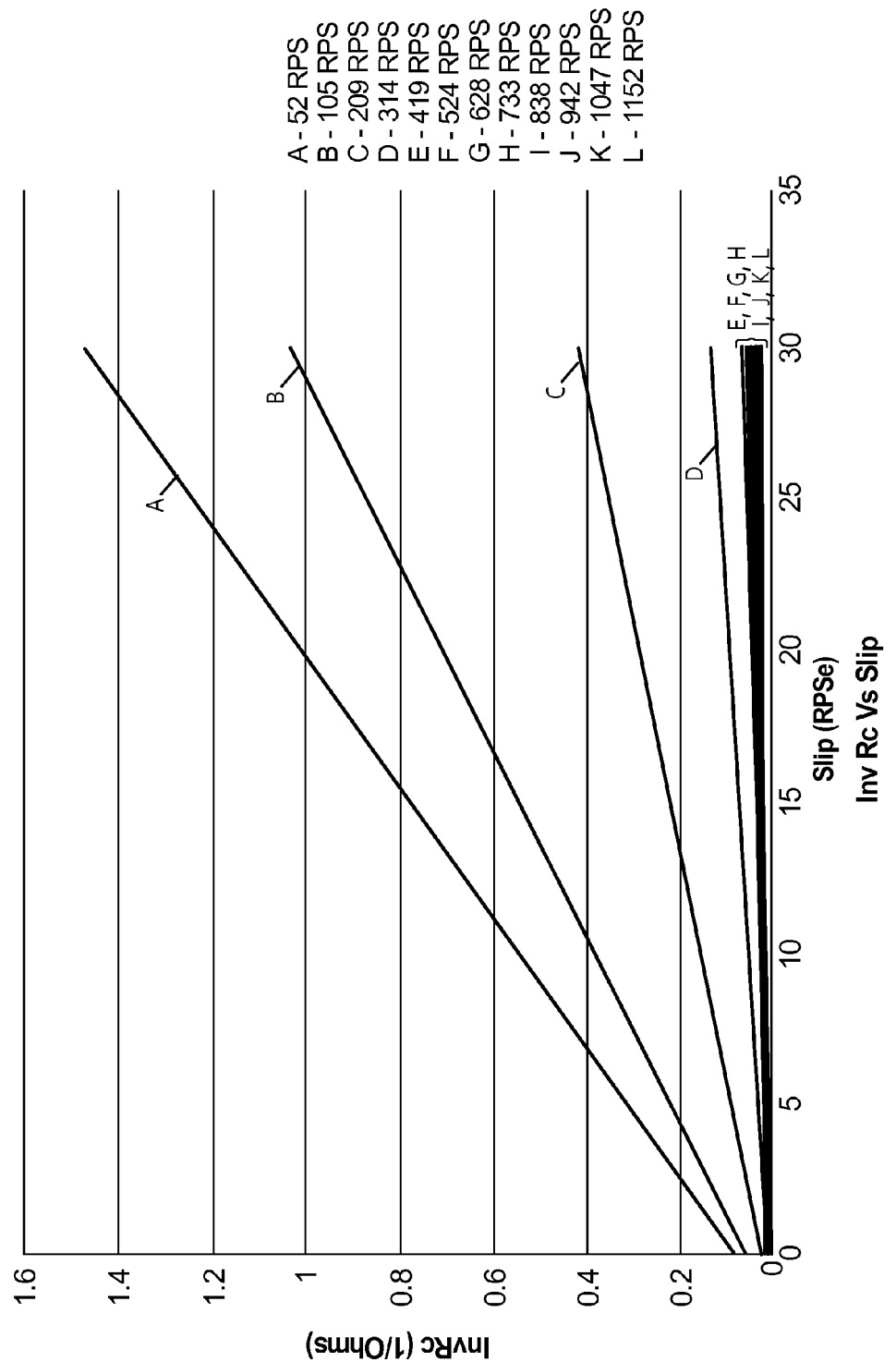

MACHINE LOSS MODELING FOR IMPROVED FIELD ORIENTED CONTROL ACCURACY

CROSS-REFERENCE TO RELATED APPLICATIONS

This application claims the benefit under 35 U.S.C. § 119(e) of U.S. Provisional Application Ser. No. 61/946,561, filed Feb. 28, 2014. The entire contents and disclosure of the aforementioned provisional application is incorporated by reference as if fully set forth herein.

FIELD OF THE DISCLOSURE

This disclosure relates to controllers, a control system, a method and a program for controlling machines.

BACKGROUND OF THE DISCLOSURE

The field oriented control of torque aims to control the voltage to regulate current at a machine's terminals in order to produce a desired amount of output torque at the machines rotor. Machines have both electro-magnetic and mechanical losses. When modeling the electrical losses in the equivalent circuit of the machine, all but resistive loss has been ignored when constructing the current and slip relationships needed for field oriented control.

SUMMARY OF THE DISCLOSURE

By ignoring these losses, the accuracy of the field oriented controller can have significant errors which tend to cause the drive to under produce torque while motoring and over produce torque while regenerating. This can cause a torque commanded electric drive to fall short of its performance.

Accordingly, disclosed are a controller, a control system, a method and a program for controlling machines.

Disclosed is a method comprising determining a resistance value for a loss compensation resistor, updating at least one control equation based on an equivalent circuit using the resistance value and controlling the machine based on the updated at least one control equation.

The resistance value represents a plurality of electro-magnetic losses of a machine. The resistance value is determined from an inverse resistance value, where the inverse resistance value is based on a speed based offset and/or speed based slope and a slip speed. The machine can be either an induction machine or a permanent magnet machine.

Also disclosed is a controller which comprises a storage device and processor. The storage device is configured to store a table of inverse resistance values. The inverse resistance values are based on a speed based slope, a speed based offset and a slip speed. The processor is configured to determine a resistance value for a loss compensation resistor based on the slip speed and an operating speed using the stored table of inverse resistance values. The resistance value represents a plurality of electro-magnetic losses of an induction machine. The processor is further configured to update at least one control equation based on at least one equivalent circuit using the resistance value. The processor is further configured to control the induction machine based on the updated at least one control equation.

Also disclosed is a controller which comprises a storage device and processor. The storage device is configured to store a table of inverse resistance values. The inverse resistance values being based on a speed based offset. The processor is configured to determine a resistance value for a loss compensation resistor based on an operating speed using the stored table of inverse resistance values. The resistance value represents a plurality of electro-magnetic losses on a machine. The processor is further configured to update at least one control equation based on at least one equivalent circuit using the resistance value. The processor is further configured to control the permanent magnet machine based on the updated at least one control equation.

Also disclosed is a computer readable storage device having a program of instructions, which when executed by a processor, causes the processor to execute determining a resistance value for a loss compensation resistor, updating at least one control equation based on an equivalent circuit using the resistance value, and controlling the machine based on the updated at least one control equation. The resistance value represents a plurality of electro-magnetic losses of a machine. The resistance value is determined from an inverse resistance value, where the inverse resistance value is based on a speed based offset and/or speed based slope and a slip speed.

BRIEF DESCRIPTION OF THE DRAWINGS

Various objects, features and advantages of the present disclosure will become apparent to one skilled in the art, in view of the following detailed description taken in combination with the attached drawings, in which:

FIG. 6 illustrates a graph associated with an example of performance tests at sample RPS points in accordance with aspects of the disclosure;

DETAILED DESCRIPTION

Figure 1A:
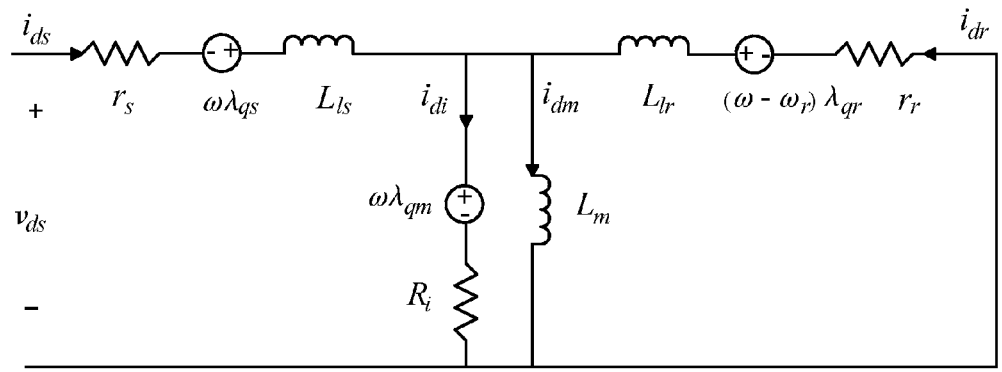
FIG. 1A illustrates a d-axis equivalent circuit of an induction machine in accordance with aspects of the disclosure.

For purpose of the description in this disclosure, the following notations will be used.

$b_{rc}$ Loss offset
$f_{dq}$ Complex vector quantity
$f_\alpha = f_q^s$ Real vector component in stationary frame
$f_\beta = -f_d^s$ Imag vector component in stationary frame
$f_d$ D axis quantity
$f_q$ Q axis quantity
$\hat{f}$ Estimated quantity
$f^*$ Commanded quantity
$\lambda_m$ Mutual flux linkage
$\lambda_r$ Rotor flux linkage
$\lambda_s$ Stator flux linkage
$i_l$ Loss current
$i_m$ Magnetizing current
$i_r$ Rotor current
$i_s$ Stator current
$L_{dq}$ DQ stator inductance
$L_m$ Mutual inductance
$L_r$ Rotor inductance
$L_s$ Stator inductance
$L_1 = L_{ls}$ Stator leakage inductance
$L_2 = L_{lr}$ Rotor leakage inductance
$m_{rc}$ Loss slope
$\omega$ Arbitrary speed
$\omega_e$ Electrical speed
$\omega_r = \omega r_e$ Rotor electrical speed
$\omega_{slip}$ Slip speed
p Poles
$P_L$ Loss power
$R_i = R_c$ Lumped loss resistance
$r_r$ Rotor resistance
$r_s$ Stator resistance $\rho = \dfrac{d}{dt}$ Derivative operator $\sigma$ Coupling coefficient
$T_e$ Electromechanical torque
$v_{dc}$ DC link voltage
$v_s$ Stator voltage quantity Induction machines and permanent magnet machine can be modeled using equations derived from equivalent circuits. The stator voltages can be determined using the following equations:

$$v_{ds} = r_s i_{ds} + \frac{d\lambda_{ds}}{dt} - \omega \lambda_{qs} \tag{1}$$

$$v_{qs} = r_s i_{qs} + \frac{d\lambda_{qs}}{dt} + \omega \lambda_{ds} \tag{2}$$

The rotor voltages can be determined using the following equations:

$$0 = r_r i_{dr} + \frac{d\lambda_{dr}}{dt} - (\omega - \omega_r)\lambda_{qr} \tag{3}$$

$$0 = r_r i_{qr} + \frac{d\lambda_{qr}}{dt} + (\omega - \omega_r)\lambda_{dr} \tag{4}$$

Currents can be determined using the following equations:

$$i_{ds} + i_{dr} = i_{dm} \tag{5}$$

$$i_{qs} + i_{qr} = i_{qm} \tag{6}$$

Stator Flux Linkages can be determined using the following equations:

$$\lambda_{ds} = \lambda_{dm} + L_1 i_{ds} \tag{7}$$

$$\lambda_{qs} = \lambda_{qm} + L_1 i_{ds} \tag{8}$$

Rotor Flux Linkages can be determined using the following equations:

$$\lambda_{dr} = \lambda_{dm} + L_2 i_{dr} \tag{9}$$

$$\lambda_{qr} = \lambda_{qm} + L_2 i_{qr} \tag{10}$$

The mutual flux Linkages can be determined using the following equations:

$$\lambda_{dm} = L_m i_{dm} \tag{11}$$

$$\lambda_{qm} = L_m i_{qm} \tag{12}$$

A desired torque output from the traction model can be determined using the following equations:

$$T_e = \frac{3}{2} \frac{p}{2} \frac{L_m}{L_r} (\lambda_{dr} i_{qs} - \lambda_{qr} i_{ds}) \tag{13}$$

The command currents to achieve the desired torque (for both the Q-axis and D-axis under rotor flux orientation) can be determined using the following equations:

$$i_{qs} = \frac{2}{3} \frac{2}{p} \frac{L_r}{L_m} \frac{T_e}{\lambda_{dr}} \tag{14}$$

$$i_{ds} = \frac{\lambda_{dr}}{L_m} \tag{15}$$

The slip speed (slip) under rotor flux orientation can be determined using the following equation:

$$(\omega_e - \omega_r) = \frac{r_r L_m i_{qs}}{L_r \lambda_{dr}} \tag{16}$$

The observed D axis flux under rotor flux orientation can be determined using the following equation:

$$\lambda_{dr} = \frac{r_r}{L_r} \int L_m i_{ds} - \lambda_{dr} \tag{17}$$

However, the above equations are based on equivalent circuits that ignore certain electro-magnetic losses such as a PWM loss, core loss, and stray load loss. In accordance with aspects of the disclosure, a Loss Compensation Resistor $R_i$, (also described herein as $R_c$) is added to equivalent circuits to account for these losses.

Figure 3:
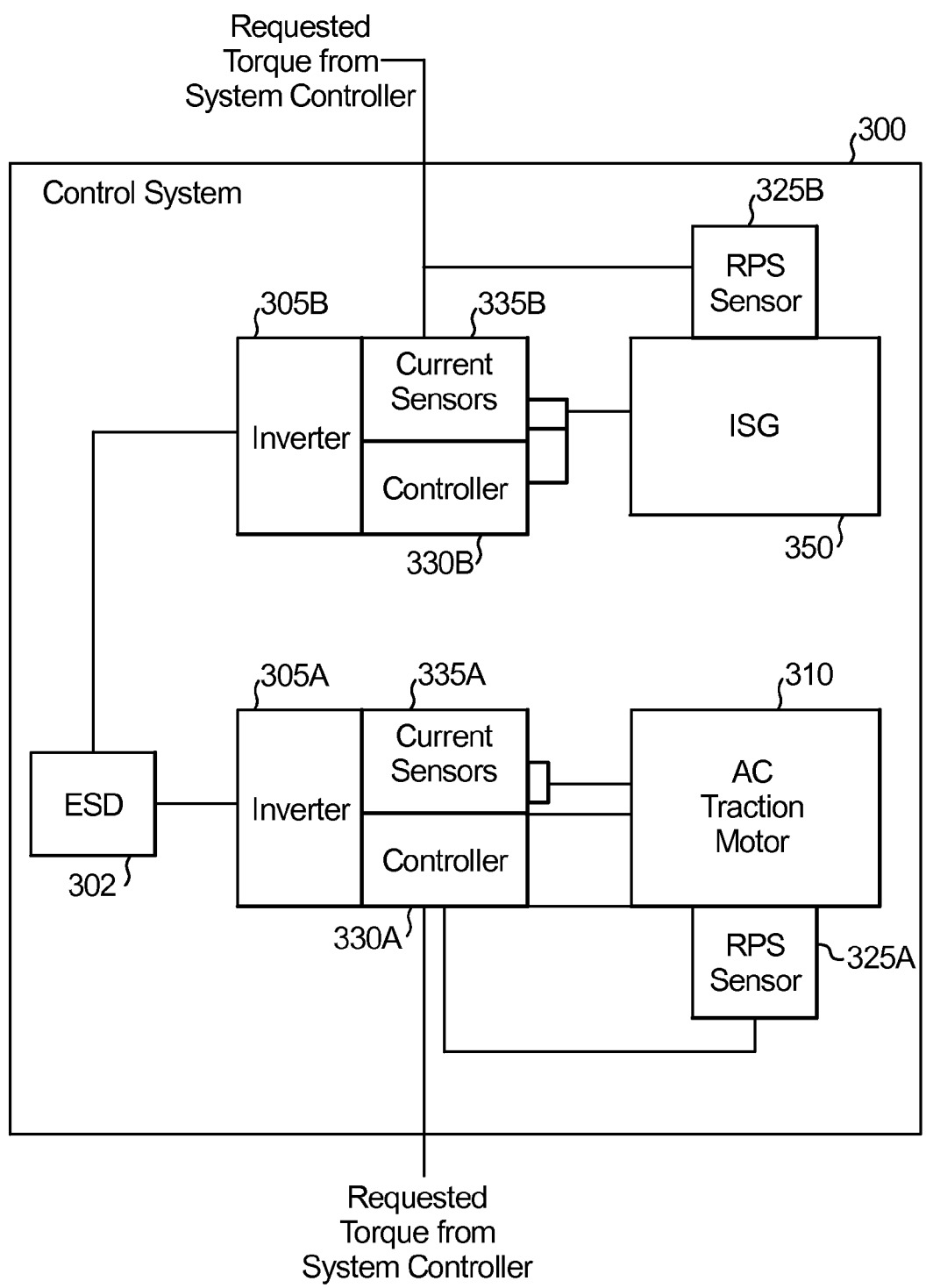
FIG. 3 illustrates a block diagram of a control system in accordance with aspects of the disclosure.

A machine can operate in two modes: motoring and generator. FIG. 3 depicts two machines: AC Traction Motor 310 and Integrated Starter Generator (ISG) 350. The AC Traction Motor 310 is an example of an induction machine. The ISG is an example of permanent magnetic machine.

When the machine is operating in motoring mode, the electrical power from the inverter 305 is supplied to the machine. The mechanical power supplied to an output shaft 315 by the machine is the difference between the supplied power from the inverter 305 and the electro-magnetic and mechanical losses. When the machine is in generator mode, mechanical power is supplied from the output shaft 315 to the machine and machine supplies electrical power to the inverter 305. The difference between the mechanical power supplied from the output shaft 315 and the electrical power supplied to the inverter 305 are the electro-magnetic and mechanical loses.

Figure 1B:
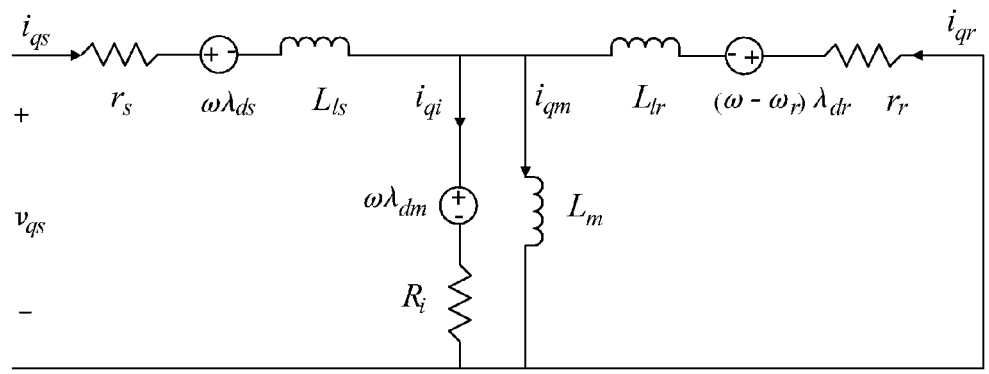
FIG. 1B illustrates a q-axis equivalent circuit of an induction machine in accordance with aspects of the disclosure.

FIGS. 1A and 1B depict equivalent circuits for an induction machine. FIG. 1A is a d-axis equivalent circuit and FIG. 1B is a q-axis equivalent circuit, both in an arbitrary reference frame rotating at speed w. As can be seen in both figures, a Loss Compensation Resistor $R_i$ is included in parallel with the Mutual Inductance $L_m$. In FIG. 1A, the stator is modeled as a resistor $r_s$, a Stator leakage inductance $L_{ls}$ and a cross coupled stator flux linkage $\lambda_{qs}$ times speed. The rotor is modeled as a resistor $r_r$, a rotor leakage inductance $L_{lr}$ and a cross coupled rotor flux linkage $\lambda_{qr}$ times speed difference. A cross coupling voltage is placed in series with the Loss Compensation Resistor. The cross coupling voltage is models as speed times the Mutual flux linkage $\lambda_{qm}$.

In FIG. 1B, the stator is modeled as a resistor $r_s$, a Stator leakage inductance $L_{ls}$ and a cross coupled stator flux linkage $\lambda_{ds}$ times speed. The rotor is modeled as a resistor $r_r$, a rotor leakage inductance $L_{lr}$ and a cross coupled rotor flux linkage $\lambda_{dr}$, times speed difference. A cross coupling voltage is placed in series with the Loss Compensation Resistor. The cross coupling voltage is models as speed times the Mutual flux linkage $\lambda_{dm}$.

A method of determining $R_i$ will be described later in detail.

In accordance with aspects of the disclosure, the control equations are modified based on the circuits depicted in FIGS. 1A and 1B. The control equations are for an indirect Rotor Flux Oriented Control Method. However, other control methods can be used.

For example, air gap voltages are determined using the following equations:

$$R_i i_{di} = \frac{d\lambda_{dm}}{dt} - \omega \lambda_{qm} \qquad (18)$$

$$R_i i_{qi} = \frac{d\lambda_{qm}}{dt} + \omega \lambda_{dm} \qquad (19)$$

The currents are determined using the following equations:

$$i_{ds} + i_{dr} = i_{dm} + i_{di} \qquad (20)$$

$$i_{qs} + i_{qr} = i_{qm} + i_{qi} \qquad (21)$$

$i_{qi}$ and $i_{di}$ reflect the loss current based on the Loss Compensation Resistor $R_i$.

Steady state currents under rotor flux orientation loss are determined using the following equations:

$$i_{di}^e = -\frac{\omega_e \lambda_{qm}^e}{R_i} \qquad (22)$$

$$i_{qi}^e = -\frac{\omega_e \lambda_{dm}^e}{R_i} \qquad (23)$$

The Slip speed is determined using the following equation:

$$(\omega_e - \omega_r) = \frac{r_r L_m (i_{qs} - i_{qi})}{L_r \lambda_{dr}} \qquad (24)$$

For equation 24, the rotor flux is aligned with the D-axis, namely $\lambda_{qr} = 0$
Equation 24 is derived from the following equations:
The Q axis rotor voltage equals zero $$0 = r_r i_{qr} + \frac{d\lambda_{qr}}{dt} + (\omega_e - \omega_r)\lambda_{dr} \qquad (24\text{-}1)$$

Solving for slip speed from Equation 24-1

$$(\omega_e - \omega_r) = -\frac{r_r i_{qr}}{\lambda_{dr}} \qquad (24\text{-}2)$$

The Q Axis Rotor Flux $$\lambda_{qr} = \lambda_{qm} + L_2 i_{qr} \qquad (24\text{-}3)$$

Eliminating Mutual Flux from equation 24-3

$$\lambda_{qr} = L_m(i_{qs} + i_{qr} - i_{qi}) + L_2 i_{qr} \qquad (24\text{-}4)$$

Solving for $i_{qr}$ from equation 24-4

$$i_{qr} = -\frac{L_m(i_{qs} - i_{qi})}{L_r} \qquad (24\text{-}5)$$

Slip Speed is determined by substituting equation 24-5 for $i_{qr}$ in equation 24-2.

In one aspect of the disclosure, the rotor flux is determined using the following equation:

$$\lambda_{dr} = \frac{r_r}{L_r} \int L_m(i_{ds} - i_{di}) - \lambda_{dr} \qquad (25)$$

For equation 25, the rotor flux is aligned with the D-axis, namely $\lambda_{qr} = 0$
Equation 25 is derived from the following equations:
The D axis rotor voltage equals zero.

$$0 = r_r i_{dr} + \frac{d\lambda_{dr}}{dt} - (\omega - \omega_r)\lambda_{qr} \qquad (25\text{-}1)$$

Solve for D Axis rotor current $i_{dr}$ from equation 25-1

$$i_{dr} = -\frac{1}{r_r}\frac{d\lambda_{dr}}{dt} \quad (25\text{-}2)$$

The D Axis Rotor Flux $$\lambda_{dr} = \lambda_{dm} + L_2 i_{dr} \quad (25\text{-}3)$$

Eliminating Mutual Flux from equation 25-3

$$\lambda_{dr} = L_m(i_{ds} + i_{dr} - i_{di}) + L_2 i_{dr} \quad (25\text{-}4)$$

Solving for $i_{dr}$ from equation 24-4

$$i_{dr} = \frac{\lambda_{dr} - L_m(i_{ds} - i_{di})}{L_r} \quad (25\text{-}5)$$

Equations 25-2 and 25-5 are set to equal each other $$-\frac{1}{r_r}\frac{d\lambda_{dr}}{dt} = \frac{\lambda_{dr} - L_m(i_{ds} - i_{di})}{L_r} \quad (25\text{-}6)$$

The D axis flux is solved for using equation 25-6.

The regulated currents to produce a desired torque are determined using the following equations:

$$i_{qs} = \frac{2}{3}\frac{2}{p}\frac{L_r}{L_m}\frac{T_e}{\lambda_{dr}} + i_{qi} \quad (26)$$

$$i_{ds} = \frac{\lambda_{dr}}{L_m} + i_{di} \quad (27)$$

In one aspect of the disclosure, the observed mutual flux is determined using the following equation:

$$\lambda_{dqm} = \frac{L_m}{L_r}(\lambda_{dqr} + L_2(i_{dqs} - i_{dqi})) \quad (28)$$

In another aspect of the disclosure, flux can be determined using current and voltage modeled rotor flux observers.

Current model rotor flux observer is determined using the following equations:

$$\frac{d\lambda_{dr}}{dt} = \frac{r_r}{L_r}\lambda_{dr} + \frac{r_r}{L_r}L_m(i_{qs} - i_{qi}) \quad (29)$$

$$\frac{d\lambda_{qr}}{dt} = \frac{r_r}{L_r}\lambda_{qr} + \frac{r_r}{L_r}L_m(i_{ds} - i_{qi}) \quad (30)$$

Voltage model rotor flux observer is determined using the following equations:

$$\lambda_{dqs} = \int v_{dqs} - r_s i_{dqs} \quad (31)$$

$$\lambda_{dqr} = \frac{L_r}{L_m}(\lambda_{dqs} - L_s \sigma i_{dqs}) + L_2 i_{dqi} \quad (32)$$

Figure 2A:
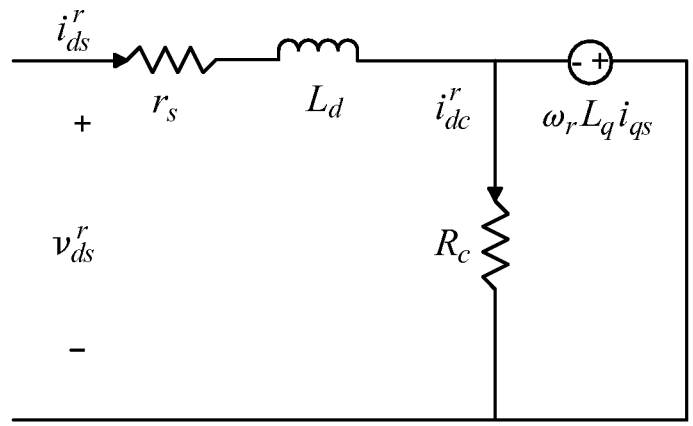
FIG. 2A illustrates a d-axis equivalent circuit of a permanent magnet machine in accordance with aspects of the disclosure.
Figure 2B:
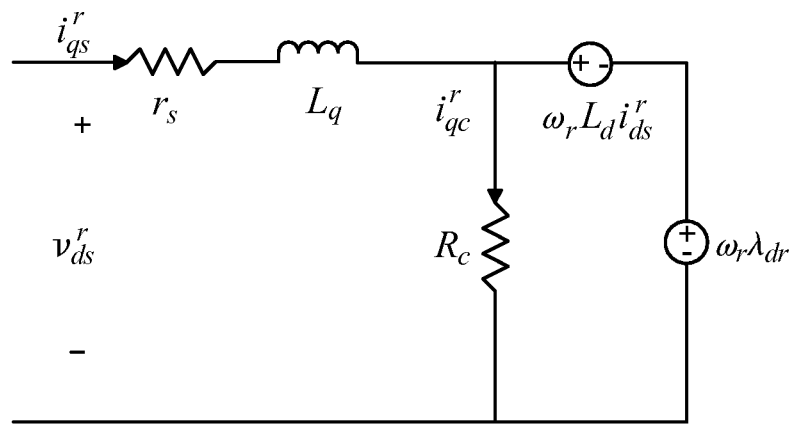
FIG. 2B illustrates a q-axis equivalent circuit of a permanent magnet machine in accordance with aspects of the disclosure.

FIGS. 2A and 2B depict equivalent circuits for a permanent magnet machine. FIG. 2A is for the d-axis and FIG. 2B is for the q-axis.

The equivalent circuits depicted in FIGS. 2A and 2B include a Loss Compensation Resistor $R_c$. For the purposes of the described $R_c$ and $R_i$ are used interchangeably.

The equivalent circuits are modeled with a rotating frame of reference. The reference frame is rotating at the electric speed of the permanent magnet machine.

The stator is modeled as a resistor and cross coupling voltage sources are models as voltages sources in the respective circuits. For example, in FIG. 2A, the cross coupling voltage is modeled as the speed of the rotor, the q axis current of the stator (in a rotating frame of frame) and q-axis inductance, e.g., $L_q$. As depicted in FIG. 2A, the equivalent circuit includes a stator resistor $r_s$ in series with an d-axis inductance $L_d$. As depicted in FIG. 2B, the equivalent circuit includes a stator resistor $r_s$ in series with a q-axis inductance $L_d$. In FIG. 2B, the cross coupling voltage is modeled as the speed of the rotor, the d axis current of the stator (in a rotating frame of frame) and d-axis inductance, e.g., $L_q$. In FIG. 2B, an additional voltage source is models as the speed of the rotor and d-axis rotor flux linkage.

The stator loss voltages are determined using the following equations:

$$R_i i_{di} = \frac{d\lambda_{ds}}{dt} - \omega\lambda_{qs} \quad (33)$$

$$R_i i_{qi} = \frac{d\lambda_{qs}}{dt} + \omega\lambda_{ds} \quad (34)$$

The steady state rotating loss currents are determined using the following equations:

$$i_{di}^e = -\frac{\omega_e \lambda_{qs}^e}{R_i} \quad (35)$$

$$i_{qi}^e = \frac{\omega_e \lambda_{ds}^e}{R_i} \quad (36)$$

The regulated currents to produce a desired torque are determined using the following equations:

$$i_{qs} = \frac{2}{3}\frac{2}{p}\frac{T_e}{\lambda_{dr}} + i_{qi} \quad (37)$$

$$i_{ds} = \frac{\lambda_{dr}^* - \lambda_{dr}}{L_{dq}} + i_{di} \quad (38)$$

The observed stator flux is determined using the following equation:

$$\lambda_{dqs} = \lambda_{dqr} + L_{dq}(i_{dqs} - i_{dqi}) \quad (39)$$

FIG. 3 illustrates an example of a control system in accordance with aspects of the disclosure. As depicted in FIG. 3, the Control System 300 can control two machines, an AC Traction Motor 310 and an ISG 350. Each machine is coupled to an Inverter 305, the Inverter 305A is coupled to AC Traction Motor 310 and the Inverter 305B is coupled to the ISG 350. The structure of each Inverter 305A or 305B is similar. Inverter 305A includes a Controller 330A and one or more Current Sensors 335A. Inverter 305B includes a Controller 330B and one or more Current Currents 335B. The Current Sensors 335A and 335B are configured to measure the regulated current within the machines, e.g., the AC Traction Motor 310 and ISG 350. The Inverters 305A and 305 are coupled for an energy storage device (ESD) 302. The ESD 302 can be a high voltage battery.

Inverse resistor values are determined from a linear equation as a function of slip speed where speed based slopes and offset are looked up from look up tables that are created and stored in the Controllers 330A and 330B in the Inverters 305A and 305B, one table for each machine. The resistor value look up table is subsequently used to calculate the Loss Compensation Resistor $R_t$ or $R_c$ for the equivalent circuits and update equations 18-39 based thereon. The resistor value look up tables are populated based on tests on a test station.

The value of the Loss Compensation Resistor $R_t$ or $R_c$ is determined based on losses that have been previously not accounted for in field oriented control. In an aspect of the disclosure, certain losses, e.g., PWM and core losses can be determined from a series of coast down tests. In an aspect of the disclosure coast down tests are run.

Figure 9:
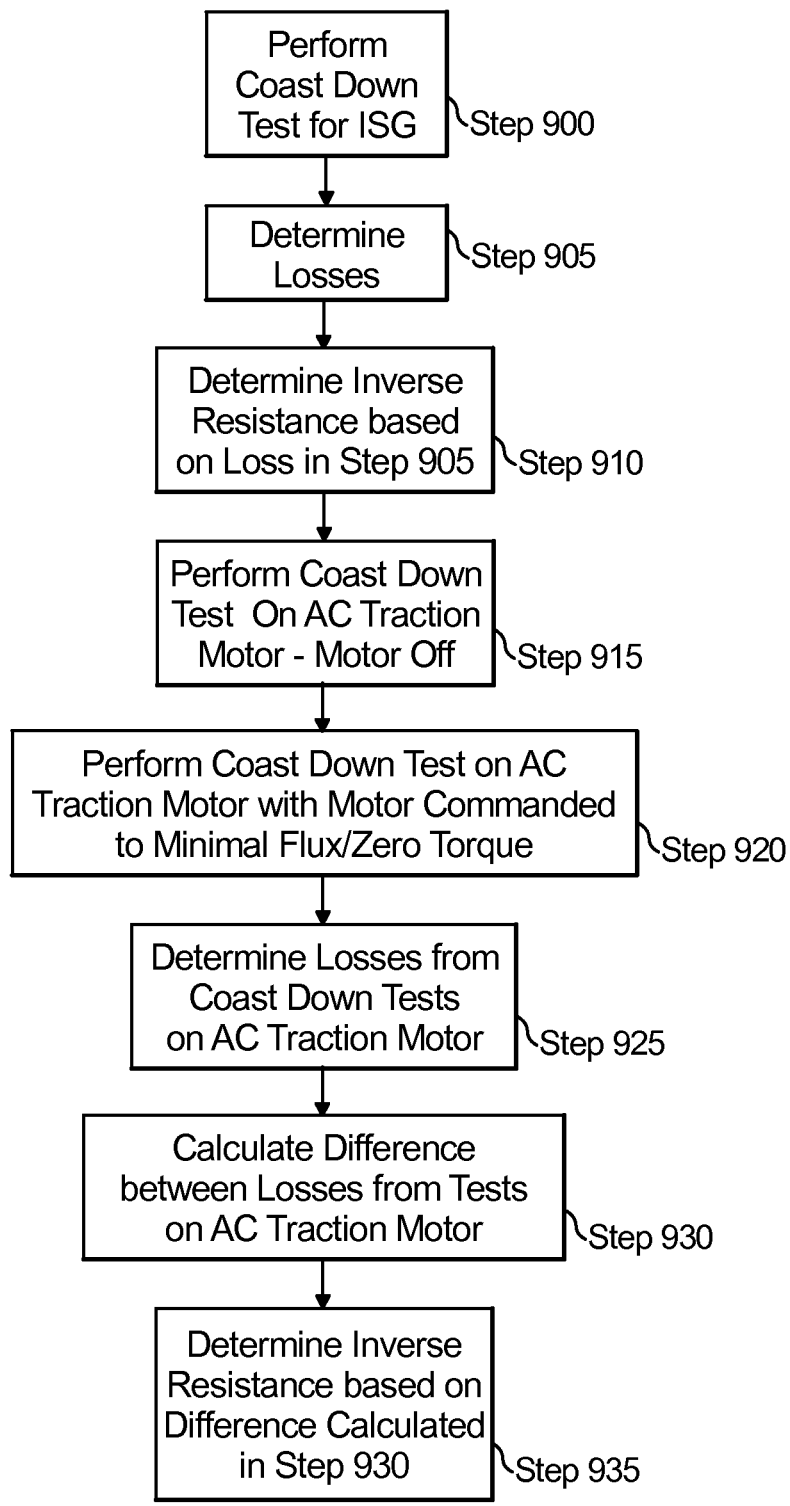
FIGS. 9-10 illustrate a method for determining a resistance value for a Loss Compensation Resistor in accordance with aspects of the disclosure.
Figure 10:
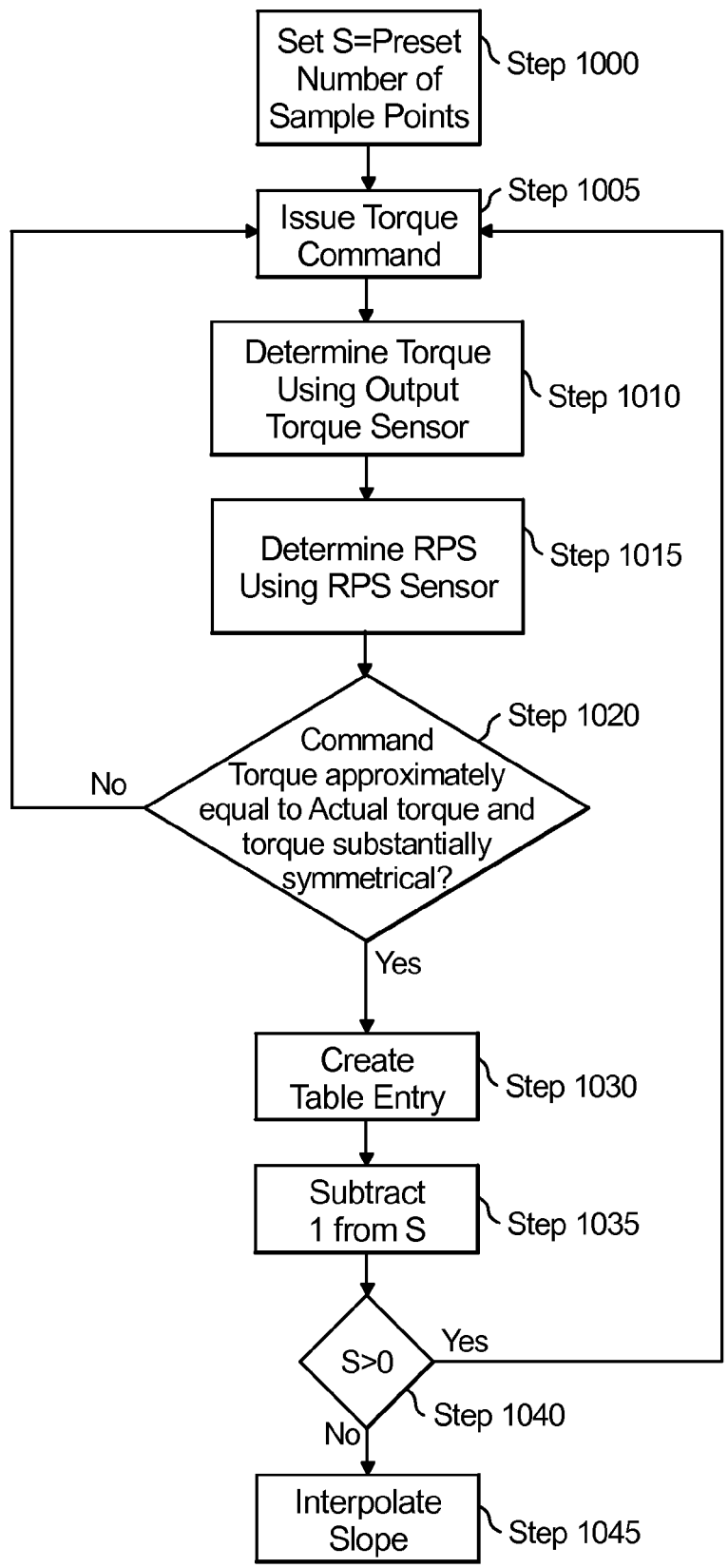

FIGS. 9-10 illustrate a method for creating a look up table or chart for the resistance value. FIG. 9 depicts a method of determining a resistance offset as a function of speed. FIG. 10 illustrates a method of determining resistance slope as a function of slip speed and speed.

At step 900, a coast down test is run for a permanent magnet machine. The following description refers to an ISG as an example of a permanent magnet machine. However, the coast down test can be applied to any permanent magnet machine. An ISG is used for descriptive purposes only. The coast down test is run on a test bench. The test bench includes a power supply such as a battery, the Inverter 305B, speed sensor and ISG 350. The ISG 350 is driven to a maximum speed. Afterwards, the ISG 350 is regulated to zero current, e.g., no torque. The ISG 350 speed is reduced.

In as aspect of the disclosure, the speed is monitored by a sensor (such as an RPS Sensor) and the Controller 330B. The speed is in radians per second. The sensor can be a rotary position/speed sensor such as an encoder or resolver. In another aspect of the disclosure, the speed and losses are monitored and calculated externally and the final look up table having offset is uploaded into the Controller 330B.

At step 905, the Controller 330B determines the losses resulting from the coast down test. The losses are determined based on a change in speed over time. A derivative of the speed as a function of time is calculated to get acceleration. The drag torque is determined by multiplying the acceleration by the inertia of the ISG 350. The loss (W) is calculated by multiplying the drag torque by the speed of the ISG 350. Mechanical losses during this coast down test are assumed to be negligible or must be removed from cost down losses. In an aspect of the disclosure, if significant mechanical losses are expected in a specific permanent magnet machine, the mechanical losses are isolated by performing an additional coast down test where the magnets on the rotor are demagnetized (rendered inert) and the Inverter is off or disabled.

Figure 4A:
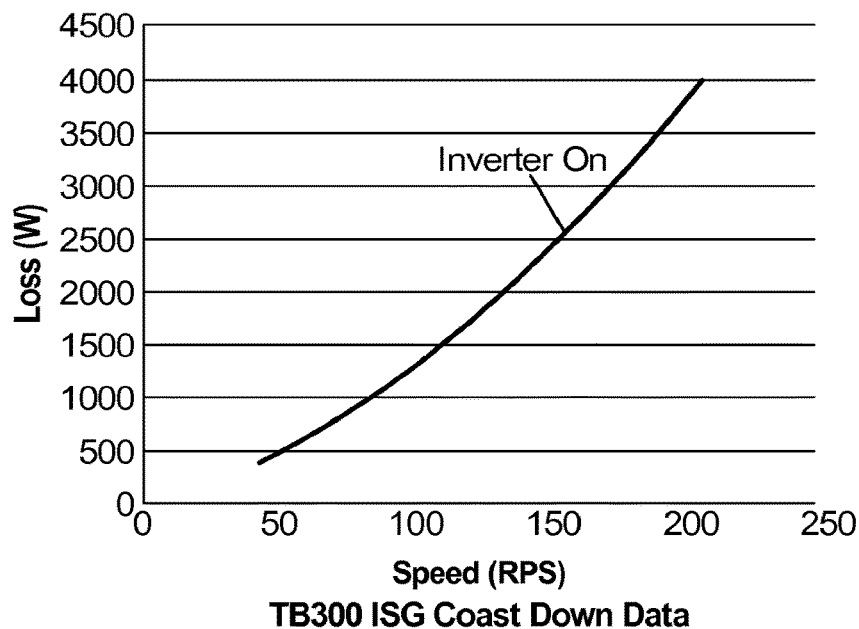
FIG. 4A illustrates a graph associated with an example of a coast down test for an ISG, which is an example of a permanent magnet machine in accordance with aspects of the disclosure.

FIG. 4A depicts an example of results from a coast down test for the ISG. As can be seen, the losses increase with the speed of the ISG. During the coast down test for the ISG, the inverter is ON.

At step 910, the determined losses are converted into an inverse resistance using the following equation:

$$\frac{1}{R_c} = \frac{P_L(\omega)}{\frac{3}{2}(\omega_e \lambda_{dr})^2} \quad (40)$$

In an aspect of the disclosure, the Controller 330B converters the losses into an inverse resistance. In another aspect of the disclosure, the conversion is external.

Figure 4B:
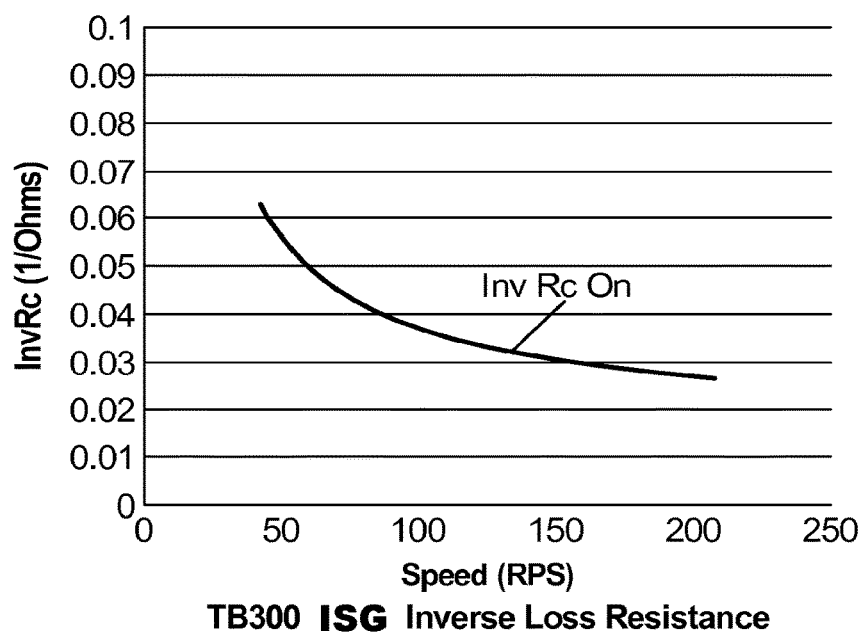
FIG. 4B illustrates a graph of an inverse resistance value calculated for the coast down test depicted in FIG. 4A in accordance with aspects of the disclosure.

FIG. 4B depicts an inverse resistance as a function of speed for the ISG 350 based on the determined losses from FIG. 4A. The inverse resistance can be converted into a resistor value for the Loss Compensation Resistor of the ISG 350. The resistor values can be stored in a table or chart for subsequent usage.

Starting with step 915, the coast down test can be run on an induction machine such as an AC Traction Motor. The tests are run on a test bench. The test bench includes a power source, Inverter 305A, speed sensor and the AC Traction Motor 310.

At step 915, a second coast down test is run with the AC Traction Motor 310. The following description refers to an AC Traction Motor as an example of an induction machine. However, the coast down test can be applied to any induction machine. An AC Traction Motor 310 is used for descriptive purposes only.

In this coast down test, AC Traction Motor 310 is driven to a maximum speed. Once at maximum speed, the Inverter is shut off. This test captures the mechanical losses.

At step 920, another coast down test is run where the AC Traction Motor 310 is commanded to a minimal flux with no torque. To obtain no torque, the q axis current Iq is regulated to zero. To obtain minimal flux, the d axis current is regulated to a minimal value. The current regulation is achieved by changing voltage supplied to the AC Traction Motor 310 via switches in the Inverter 305A. For example, the minimal flux can be 0.06 Vs. However, another minimal value can be used. This test captures no load losses including mechanical, iron core losses and PWM losses. The induction machine such as the AC Traction Motor 310 slows from full speed to zero speed due to the losses. When the machine is idling with the minimal flux, the fluxing current is regulated. There are electro-magnet losses associated including hysteretic iron losses due to the flux passing through the iron and eddy current losses causes by the ripple current imposes by the PWM within the Inverter 305A.

The speed is monitored by the sensor such as a RPS Sensor, which outputs the monitored speed to the Controller 330A. In another aspect of the disclosure, the speed and losses are monitored and calculated externally and the final look up tables having the speed based slopes and offset are uploaded into the Controller 330A. The coast down tests on the AC Traction Motor 310 isolate the mechanical losses from the PWM and core losses.

At step 925, the Controller 330A determines the losses resulting from the coast down tests on the AC Traction Motor 310. While step 925 is depicted after steps 915 and 920, the losses can be determined as part of the individual tests. The losses are determined in a similar manner as described above.

Figure 5A:
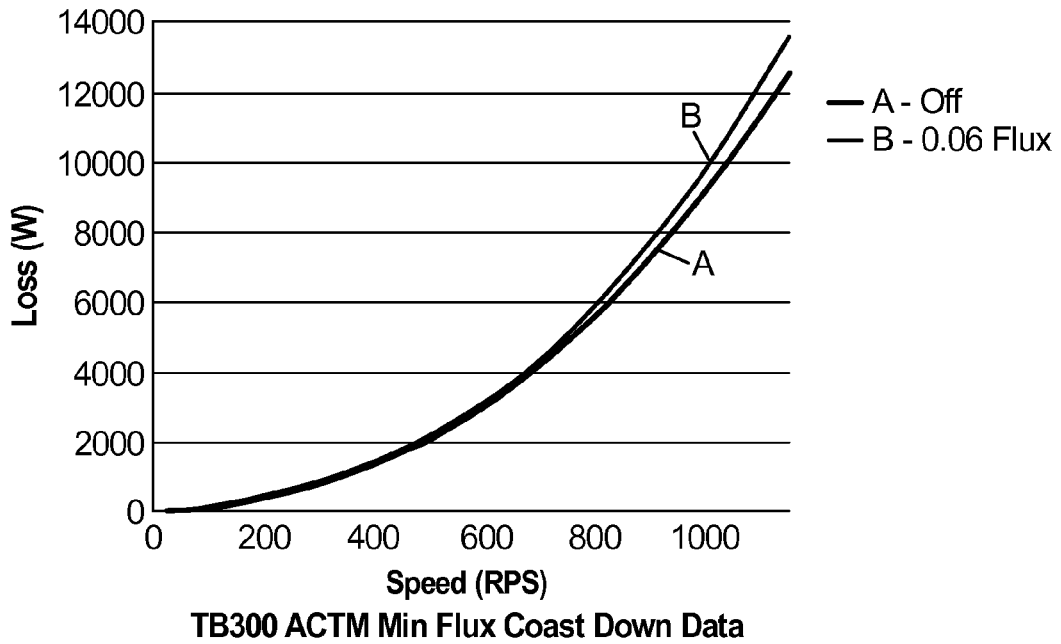
FIG. 5A illustrates a graph associated with an example of two coast down tests for an AC traction motor, which is an example of an induction machine in accordance with aspects of the disclosure.

FIG. 5A depicts an example of the results from the two coast down tests on the AC Traction Motor (curve A-motor off) (curve B-minimal flux and no torque). The difference between the two curves A and B is the PWM and core losses. At step 930, the Controller 330A calculates the difference between the two curves (A and B) to determine the PWM and core losses. In another aspect of the disclosure, the difference is calculated externally.

At step 935, the determined losses are converted into an inverse resistance using equation 40. The PWM and core losses define an offset for the inverse resistance. In an aspect of the disclosure, the Controller 330A converts the losses into an inverse resistance. In another aspect of the disclosure, the conversion is external.

Figure 5B:
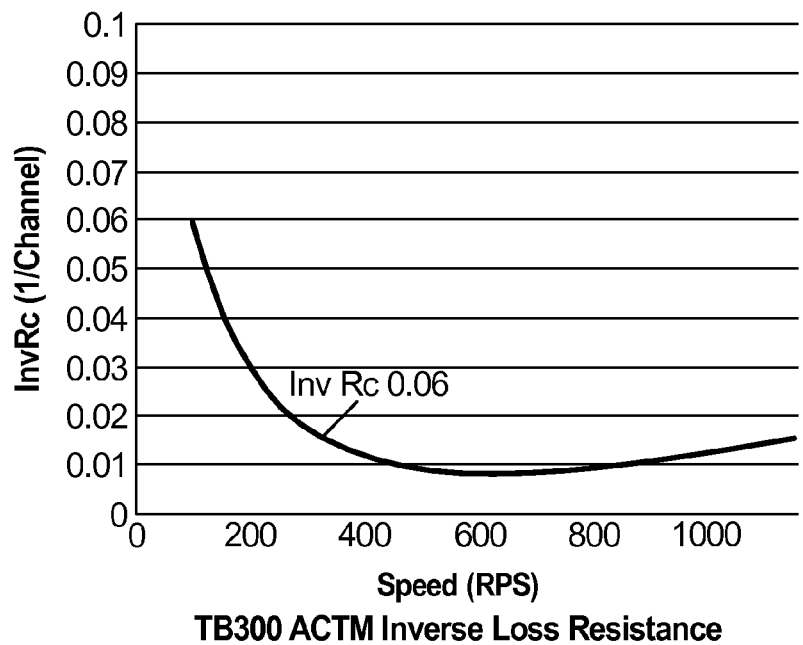
FIG. 5B illustrates a graph of an inverse resistance value calculated for the coast down tests depicted in FIG. 5A in accordance with aspects of the disclosure.

FIG. 5B depicts an inverse resistance (e.g., offset) as a function of speed for the AC Traction Motor 310 based on the determined losses from FIG. 5A.

The inverse resistance curve is shown for the minimal flux of 0.06 Vs.

Induction Machine (such as an AC Traction Motor) stray load loss can be determined as a function of slip speed. The stray load loss defines a resistance slope. There is no slip based-stray load loss for a permanent magnet machine such as an ISG, since the slip speed is zero.

FIG. 10 illustrates a method of determining the slope (stray load loss). The steps depicted in FIG. 10 are only performed for an induction machine such as a AC Traction Motor. In an aspect of the disclosure, the stray load loss is determined using a linear relationship with the slip speed. The linear relationship is determined by sampling the performance of the AC Traction Motor 310 for various operating speeds on a test bench.

In an aspect of the disclosure, at least 12 sample points are used. The more sample points that are used, the more accurate an interpolation for all speeds will be.

The test bench for the performance tests includes a power source, Inverter 305A, the AC Traction Motor 310, a Speed Sensor and an Output Torque Sensor mounted on the Output Shaft of the AC Traction Motor.

The speed is measured by a speed sensor coupled to the AC Traction Motor 310. Output torque of the AC Traction Motor 310 is measured by an Output Torque Sensor coupled to an Output Shaft. In an aspect of the disclosure, the Torque Sensor can be a strain gauge.

At step 1000, a counter is set to a present number of sample points, e.g., 12. As with the previous tests, in an aspect of the disclosure, the functionality described can be performed by the Controller 330A. In another aspect of the disclosure, a test station performs the functionality. The counter counts the number of sample points. Each time the operating parameters are determined for a given sample point, 1 is subtracted from the value of the counter.

At step 1005, the Controller 330A issues a command to the AC Traction Motor 310 to output a specify torque $T_{cmd}$. In another aspect of the disclosure, the test station issues the command. In an aspect of the disclosure, an initial estimated loss resistance is set to the offset for the resistance (inverse resistance) determined from the measured speed using the curve from FIG. 5B (step 1025). The control equations are updated with the initial resistance value. The specified torque is both a positive torque and a negative torque for the same value. For example, the specified torque can be 100 and −100. The goal is to have a symmetrical actual torque based on a specified commanded torque. If the value for the Loss Compensation Resistor Ri correctly reflects the true losses, the commanded torque will equal the actual torque and the torque will be symmetrical. The Controller 330A or test station calculates the slip speed based on an initial estimated loss resistance using equation 24. The loss current $i_{qi}$ is determined using the initial estimated loss resistance.

Based on the commanded torque, the Output Torque Sensor monitors the actual output torque on the Output Shaft at step 1010. The Torque Sensor 320 outputs the determined torque to the Controller 330A or test station (for both positive and negative torque).

At substantially the same time, the speed sensor determines the speed of the AC Traction Motor at step 1015. At step 1020, the Controller 330A or test station determines if the actual torque is the approximately equal to the commanded torque. Additionally, the Controller 330A or test station determines if the torque is symmetrical. If the actual torque does not equal the commanded torque, the initial estimated loss resistance is changed to minimize the difference ("N" at step 1020), the torque command is repeated using the changed resistance in the control equations to command the commanded torque, e.g., process returns to step 1005. If the difference between the commanded torque and the actual torque is greater than zero, the estimated resistance is decreased. If the difference between the commanded torque and the actual torque is less than zero, the estimated resistance is increased.

The difference between the commanded torque and actual torque is determined by the following equation:

$$T_e^* - T_e = \frac{3}{2}\frac{p}{2}\frac{L_m}{L_r}\lambda_{dr}\omega_e\lambda_{dm}\left(\frac{1}{R_i} - \frac{1}{\hat{R}_i}\right) \quad (41)$$

$T_e$ is the actual torque measured by the Output Torque Sensor. $T_e^*$ is the commanded or specified torque by the Controller 330A or test station.

$$\frac{1}{\hat{R}_i}$$

is the estimated inverse resistance initially determined from curve depicted on FIG. 5B.

$$\frac{1}{R_i}$$

is the value for the Loss Compensation Resistor which correctly reflects the losses. Steps 1005-1020 are repeated until the actual torque measured by the Output Torque Sensor and the commanded torque are substantially equal and the torque is substantially symmetric ("Y at step 1020). "Substantially" is based on the accuracy of the Output Torque Sensor.

Once the actual torque measured by the Output Torque Sensor and the commanded torque are substantially equal and the torque is substantially symmetric, at step 1030, the Controller 330A or test station creates a table for the sample points. A new row in the table is created having the measured RPS, command Torque $T_{cmd}$, the calculated slip speed and estimated inverse resistance value where the actual torque measured by the Output Torque Sensor and the commanded torque are substantially equal and the torque is substantially symmetric for each sample point.

Table 1 is an example of the results from 12 sample points.

| RPS | Tcmd | Slip | InvRc |
|---|---|---|---|
| 1152 | 100 | 25 | 0.025 |
| 1047 | 110 | 23.5 | 0.025 |

-continued

| RPS | Tcmd | Slip | InvRc |
|-----|------|------|-------|
| 942 | 122 | 21 | 0.025 |
| 838 | 137 | 18 | 0.025 |
| 733 | 157 | 15.5 | 0.026 |
| 628 | 183 | 13 | 0.025 |
| 524 | 220 | 10.75 | 0.025 |
| 419 | 275 | 8.5 | 0.026 |
| 314 | 366 | 6.25 | 0.04 |
| 209 | 549 | 7.5 | 0.125 |
| 105 | 750 | 9 | 0.35 |
| 52 | 750 | 9 | 0.5 |

The first column is the measured RPS by the speed sensor in step 1015. The second column is the commanded torque by the Controller 330A or test station in step 1005. The third column is the calculated slip speed. The fourth column is the estimated inverse resistance value where the actual torque measured by the Output Torque Sensor and the commanded torque are substantially equal and the torque is substantially symmetric for each sample point.

At step 1035, the Controller 330A or test station subtracts 1 from the counter (S=S−1). The resultant value is compared with zero. At step 1040, the Controller 330A or test station determines if the resultant value is greater than zero. If the resultant value is greater than zero ("Y" at step 1040), the process is repeated (e.g., returns to step 1005 for another sample point). If the resultant value is not greater than zero ("N" at step 1040), e.g., equals zero, than all of the sample points have been processed.

At step 1045, the Controller 330A or test station interpolates inverse resistance values for the slope for all operating speeds.

At each speed, the slope and offset are computed by linearly connecting the slip/inverse resistance pairs from Table 1 and the zero slip coast down test. Once the slope and offset are known for each tested operating speed in Table 1, the slopes and offsets for all speed are interpolated through curve fitting.

FIG. 6 illustrates an example of the relationship between the inverse resistance and slip for the 12 sample points (curves A-L). The zero slip intercept value is based on the minimal flux coast down test described above (depicted in FIG. 5B). A second point on each line is determined from the calculated slip speed in Table 1 and the corresponding inverse resistance. A line is drawing connecting the two points. Thus, the slope of the inverse resistance verses slip speed can be determined by connecting the two points. FIG. 6 shows 12 lines where the lowest RPS, e.g., 52 exhibits the largest inverse resistance (curve A).

Figure 7:
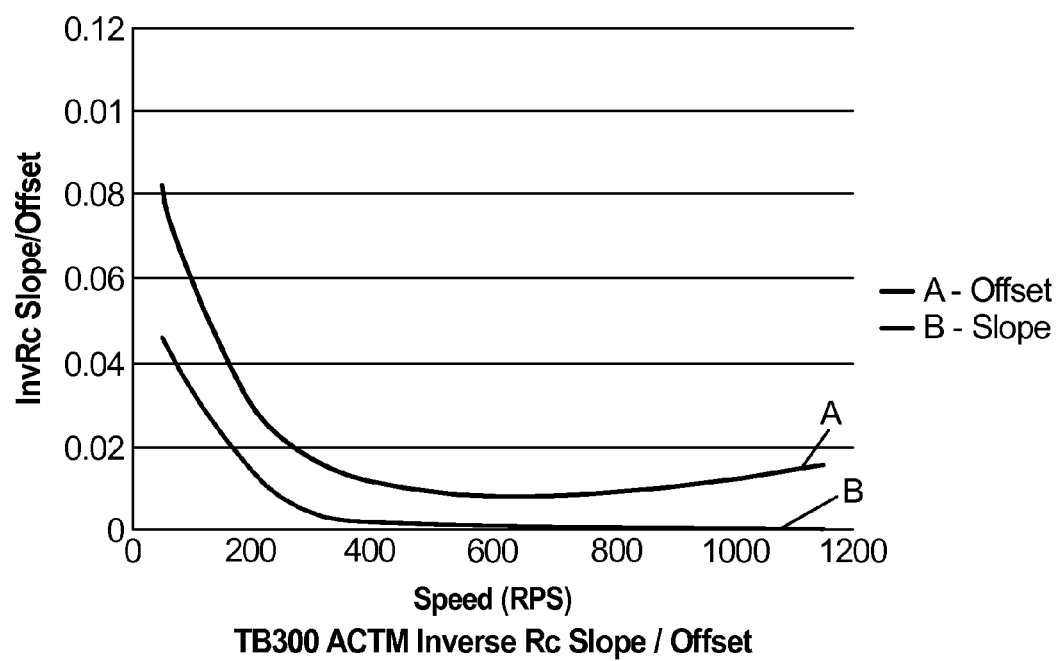
FIG. 7 illustrates a graph associated with an example of an offset and scope for calculating an inverse resistance value which can be converted into a resistance value for a loss compensating resistor in accordance with aspects of the disclosure.

FIG. 7 illustrates an example of the interpolated values for all operating speed (curve B), e.g., slope. Curve A is taken from the inverse resistance depicted in FIG. 5B. Once the offset curve A and slope curve B are determined, the values are stored in a Data Storage Device 815. If the values are calculated by the test station, the values are uploaded to the Data Storage Device using an input port. The values can be stored as a table or chart.

Figure 11:
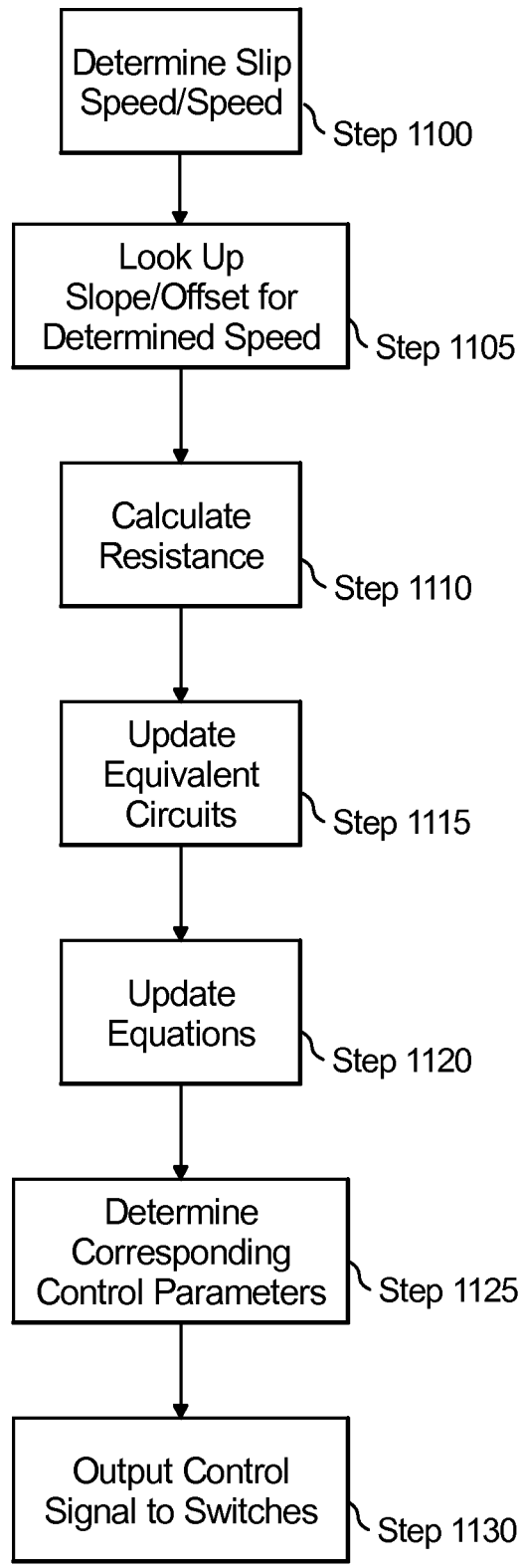
FIG. 11 illustrates a method for controlling an induction machine in accordance with aspects of the disclosure.

FIG. 11 illustrates a method for controlling an induction motor such as an AC Traction Motor 310 in accordance with aspects of the disclosure. The method is triggered by a request for torque (in motoring mode) and a regenerating power request (in generator mode).

In operation, a value for the inverse resistance is determined by the Controller 330A using equation:

$$\frac{1}{R_c} = m_{rc}\omega_{slip} + b_{rc}, \quad (42)$$

where $m_{rc}$ the slope depicted as curve B in FIG. 7 and $b_{rc}$ the offset depicted as curve A in FIG. 7. The resistor value for the Lost Compensation Resistor $R_c$ or $R_i$ is determined from the value of the inverse resistance.

Controller 330A updates the equivalent circuits depicted in FIGS. 1A and 1B, using the resistance value calculated by equation 42.

Controller 330A continuously updates the equivalent circuits and control equations as the slip speed changes and speed change. Initially, at zero slip, the inverse resistance for the offset is used, as the slip increases, the inverse resistance is updated from the equations.

At step 1100, the Controller 330A determines the current slip speed and speed of the AC Traction Motor 310. The current slip speed is calculated using equation 24. The Controller 330A retrieves the slope and offset values from one of the data storage devices 815. Using the determined speed as a key, the Controller 330A looks up the slope and offset, at step 1105. The Controller 330A calculates the inverse resistance using equation 42 at step 1110. The Controller 330A inverts inverse resistance to determine the value for the Loss Compensating Resistor $R_c$.

At step 1115, the Controller 330A updates the equivalent circuits depicted in FIGS. 1A and 1B with the calculated value for the Loss Compensation Resistor $R_i$.

At step 1120, the Controller 330A updates the control equations using the calculated value for the Loss Compensating Resistor $R_i$.

At step 1125, the required control parameters to achieve the requested torque and flux are calculated using the appropriate control equations.

At step 1130, the Controller 330A outputs the control signals via the Data Output Port 810 to voltage switches in the Inverter (not shown) to change the AC voltage supplied to the AC Traction Motor 310 which regulates the current.

As described above, symmetric torque can be obtained when the value of the resistance is determined as described above. Symmetric torque means that the losses when the AC Traction Motor 310 is operating in motoring mode and the losses when the AC Traction Motor 310 is operating in generator mode are substantially equal for respective speeds.

In an aspect of the disclosure, the torque accuracy of the drive can be improved. For example, the accuracy can be increased in excess of 10%.

Aspects of the disclosure can be applied to any induction machine. Aspects of this disclosure may be utilized in connection with a vehicle (e.g., a bus, a truck, an automobile). In one specific example, aspects of this disclosure may be applied to a hybrid vehicle.

Figure 12:
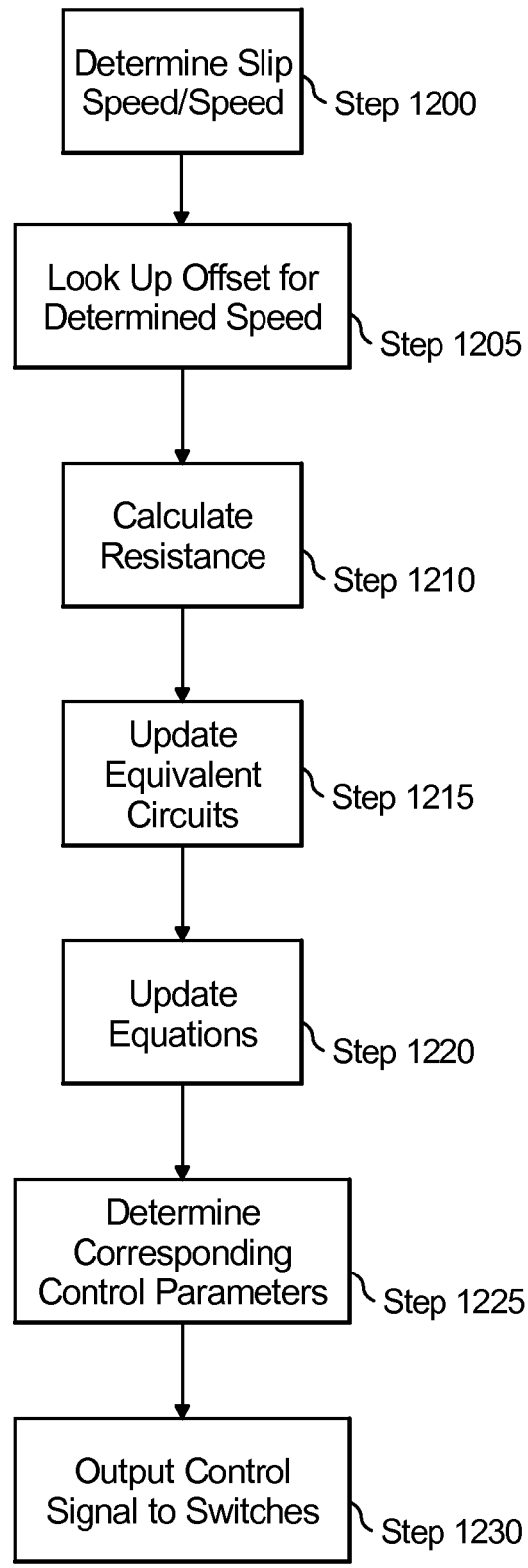
FIG. 12 a method for controlling an integrated starter generator accordance with aspects of the disclosure.

FIG. 12 a method for controlling the ISG 350 accordance with aspects of the disclosure. The method is triggered by a request for torque (in motoring mode) and a regenerating power request (in generator mode).

At step 1200, the Controller 330B determines the speed of the ISG 350 based on a signal from the RPS Sensor 325B. The Controller 330B retrieves the offset value from one of the data storage devices 815. Using the determined speed as a key, the Controller 330B looks up the offset, at step 1205. The Controller 330B calculates the inverse resistance using equation 42 at step 1210. The Controller 330B inverts inverse resistance to determine the value for the Loss Compensating Resistor $R_c$.

At step 1215, the Controller 330B updates the equivalent circuits depicted in FIGS. 2A and 2B with the calculated value for the Loss Compensating Resistor $R_c$.

At step 1220, the Controller 330B updates the control equations using the calculated value for the Loss Compensating Resistor $R_c$, e.g., equations 33-39.

At step 1225, the required control parameters to achieve the requested torque are calculated using the appropriate control equations. At step 1230, the Controller 330B outputs the control signals via the Data Output Port 810 to voltage switches in the Inverter (not shown) to change the AC voltage supplied to the ISG 350 which regulates the current.

Figure 13:
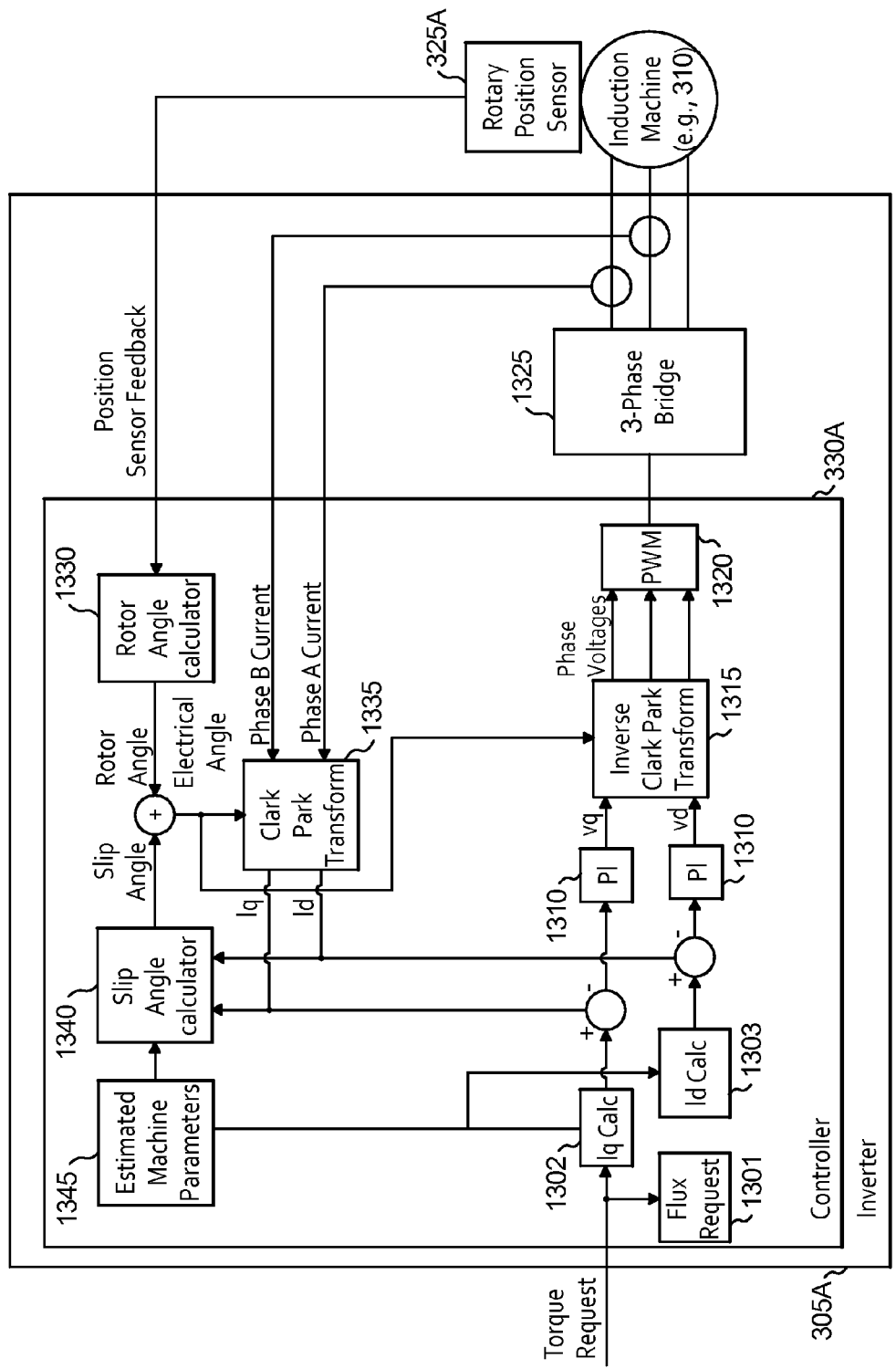
FIG. 13 illustrates an example of a control law diagram.

FIG. 13 illustrates an example of a control law diagram 1300 for rotor flux oriented control for an induction machine. As depicted, the torque request is input from the control controller.

The DC q-axis current 1302 is determined base on the torque request and Estimated machine Parameters 1345 include sensed current.

The Controller 330A derives the flux request based on the torque request and present operating conditions of the machine. The Controller 330A determines the d-axis current 1303 from the derived flux request and estimated machine parameters 1345.

The calculated Slip Angle from the Slip Angle Calculator 1340 is combined with the q-axis and d-axis current (DC) and input into proportional integral (PI) controllers 1310. The PI controllers 1310 are used to regulate d and q axis currents in the rotor flux frame and output DC voltage for the q-axis and d-axis. An Inverse-Clark Park Transform 1315 converts the DC voltage values into three-phase voltage (AC voltages). The PWM 1320 phase modulates the same outputs the modulated signals to a 3-Phase Bridge 1325. The output of the 3-phase Bridge is input into an Induction Machine (IM) such as an AC Traction Motor 310.

The RPS Sensor 325A, such as a Rotary Position Sensor is attached to a rotor of the IM in order to translate the rotor position into an electrical signal.

The Rotor Angle Calculator 1330 converts the position sensor feedback into a rotor angle. The calculated Slip angle and the converted rotor angle are added to produce an electric angle for rotor flux oriented control. The electric angle is input to both the Inverse-Clark Park Transform 1315 and the Clark Park Transform 1335. The Clark Park Transform 1335 receives two of the three-phase currents from the 3-Phase Bridge 1325 and derives the third phase. The Clark Park Transform then converts the three-phase AC current into DC d-axis current and q-axis in steady state.

In order to maintain control orientation with the rotor flux, machine parameters and the present value the current in the machine (measured by a current sensor are used to force a slip speed.

Figure 8:
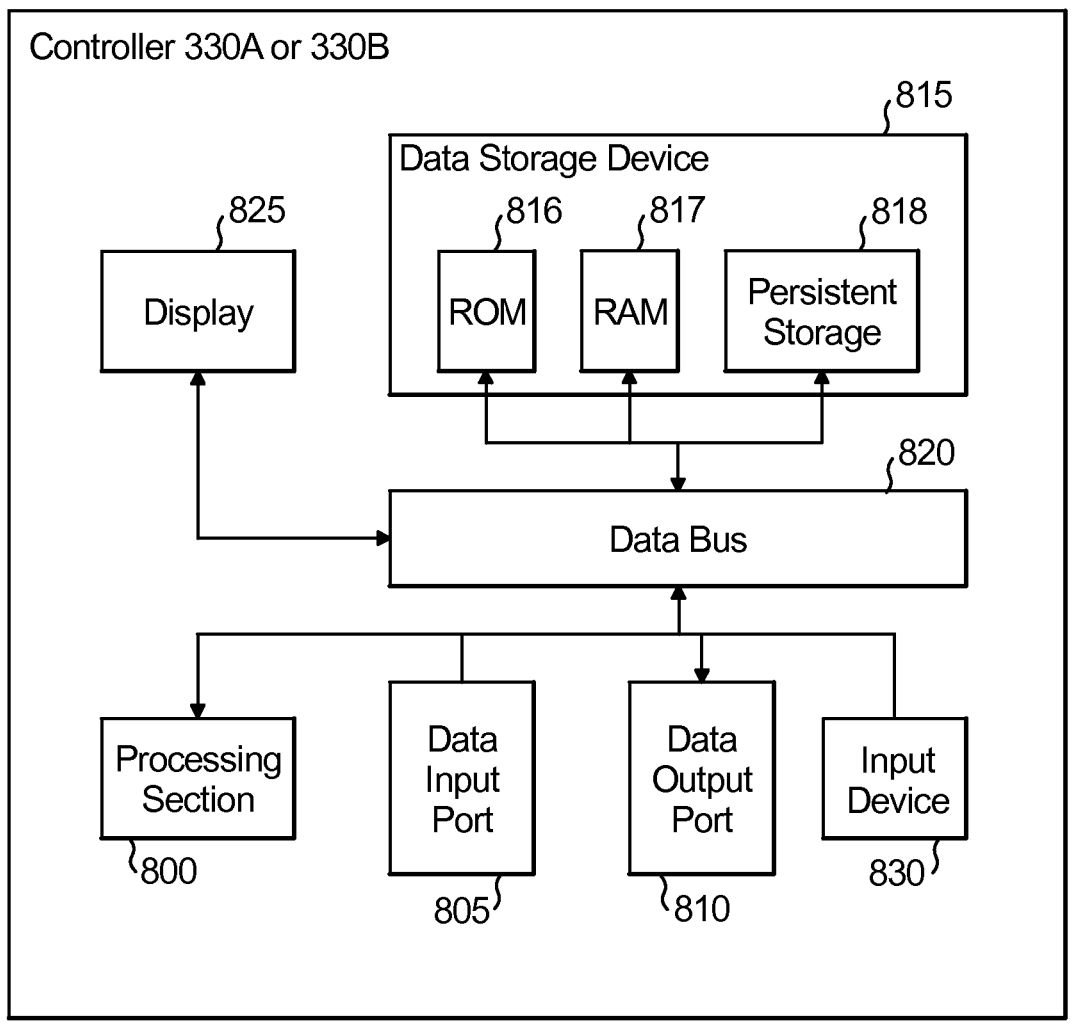
FIG. 8 illustrates a block diagram of a controller in accordance with aspects of the disclosure.

FIG. 8 illustrates an example of a respective Controller 330A and 330B in accordance with aspects of the disclosure. The Controller 330A and 330B includes a Processing Section 800. The Processing Section 800 implements the functionality described herein. The Processing Section 800 can be a CPU or a GPU. In one aspect of the disclosure, the Processing Section 800 is configured to execute one or more programs stored in a computer readable storage device, e.g., Data storage storages 815. The computer readable storage device can be RAM 817, persistent storage 818 or removable storage. For example, the Processing Section 800 can execute instructions in a program that may be loaded into RAM 817. The Processing Section 800 may include one or more processing units. The Controller 330A and 330B also includes at least one storage device, such as, but not limited to, RAM 817, ROM 816 and persistent storage 818.

The Controller 330A and 330B includes one or more external interfaces such as Data Input Port 805 and Data Output Port 810. Data is received from the RPS Sensor 325A and 325B via the Data Input Port 805. Control commands to the switches (not shown) are sent via the Data Output Port 810. FIG. 8 also depicts an input device 830 and display 825. These components are optional.

A data storage device 815 is any piece of hardware that is capable of storing information, such as, for example without limitation, data, programs, instructions, program code, and/or other suitable information, either on a temporary basis and/or a permanent basis.

In another aspect of the disclosure, an ASIC, microcontroller, FPGA, a PAL and PLA can be used as the Controller 330.

Various aspects of the present disclosure may be embodied as a program, software, or computer instructions embodied or stored in a computer or machine usable or readable medium, or a group of media which causes the computer or machine to perform the steps of the method when executed on the computer, processor, and/or machine. A program storage device readable by a machine, e.g., a computer readable medium, tangibly embodying a program of instructions executable by the machine to perform various functionalities and methods described in the present disclosure is also provided, e.g., a computer program product.

The computer readable medium could be a computer readable storage device or a computer readable signal medium. A computer readable storage device, may be, for example, a magnetic, optical, electronic, electromagnetic, infrared, or semiconductor system, apparatus, or device, or any suitable combination of the foregoing; however, the computer readable storage device is not limited to these examples except a computer readable storage device excludes computer readable signal medium. Additional examples of the computer readable storage device can include: a portable computer diskette, a hard disk, a magnetic storage device, a portable compact disc read-only memory (CD-ROM), a random access memory (RAM), a read-only memory (ROM), an erasable programmable read-only memory (EPROM or Flash memory), an optical storage device, or any appropriate combination of the foregoing; however, the computer readable storage device is also not limited to these examples. Any tangible medium that can contain, or store, a program for use by or in connection with an instruction execution system, apparatus, or device could be a computer readable storage device.

A computer readable signal medium may include a propagated data signal with computer readable program code embodied therein, such as, but not limited to, in baseband or as part of a carrier wave. A propagated signal may take any of a plurality of forms, including, but not limited to, electromagnetic, optical, or any suitable combination thereof. A computer readable signal medium may be any computer readable medium (exclusive of computer readable storage device) that can communicate, propagate, or transport a program for use by or in connection with a system, apparatus, or device. Program code embodied on a computer readable signal medium may be transmitted using any appropriate medium, including but not limited to wireless, wired, optical fiber cable, RF, etc., or any suitable combination of the foregoing.

The terms "a control system" and "Controller" as may be used in the present disclosure may include a variety of combinations of fixed and/or portable computer hardware, software, peripherals, and storage devices. The Controller and/or Control System may include a plurality of individual components that are networked or otherwise linked to perform collaboratively, or may include one or more stand-alone components. The hardware and software components of the Control System and/or Controller of the present disclosure may include and may be included within fixed and portable devices such as desktop, laptop, and/or server, and network of servers (cloud).

The terminology used herein is for the purpose of describing particular embodiments only and is not intended to be limiting the scope of the disclosure and is not intended to be exhaustive. Many modifications and variations will be apparent to those of ordinary skill in the art without departing from the scope and spirit of the disclosure.

What is claimed is:

1. A method comprising:
   determining a resistance value for a loss compensation resistor, the resistance value representing a plurality of electro-magnetic losses of an induction machine, the resistance value being determined from an inverse resistance value, where the inverse resistance value is determined by $$\frac{1}{R_c} = m_{rc}\omega_{slip} + b_{rc}, \text{ where } \frac{1}{R_c}$$

is the inverse resistance value, $m_{rc}$ is a speed based slope, $\omega_{slip}$ is a slip speed and $b_{rc}$ is a speed-based offset;
   updating at least one control equation based on an equivalent circuit using the resistance value; and
   controlling the induction machine based on the updated at least one control equation.

2. The method of claim 1, wherein the plurality of electro-magnetic losses includes core loss, stray load loss and pulse-width modulation (PWM) loss.

3. The method of claim 1, further comprising adding the loss compensation resistor to at least one equivalent circuit for the induction machine having the determined resistance value.

4. The method of claim 1, wherein the speed-based offset is determined by obtaining a difference between losses over operating speeds when the induction machine is commanded to a minimum flux and when the induction machine is off and converting the difference between losses over operating speeds into an inverse resistance over the operating speeds.

5. The method of claim 1, wherein the speed based slope is determined from a plurality of estimated resistances, each estimated resistance is determined by minimizing a difference between a commanded torque and a detected actual torque using a torque sensor on an output shaft of the induction machine, the difference being for a specific speed of the induction machine and for a calculated slip speed, and wherein the speed based slope is interpolated, for other operating speeds.

6. A controller comprising:
   a storage device configured to store a table of inverse resistance values, the inverse resistance values are determined by $$\frac{1}{R_c} = m_{rc}\omega_{slip} + b_{rc}, \text{ where } \frac{1}{R_c}$$

is an inverse resistance value, $m_{rc}$ is a speed based slope, $b_{rc}$ is a speed based offset and $\omega_{slip}$ is a slip speed; and
   a processor configured to determine a resistance value for a loss compensation resistor based on the slip speed and an operating speed using the stored table of inverse resistance values, the resistance value representing a plurality of electro-magnetic losses of an induction machine, update at least one control equation based on at least one equivalent circuit using the resistance value and control the induction machine based on the updated at least one control equation.

7. The controller of claim 6, wherein the processor is further configured to add the loss compensation resistor to the at least one equivalent circuit for the induction machine.

8. The controller of claim 6, wherein the induction machine is an AC Traction Motor.

9. The controller of claim 6, wherein the plurality of electro-magnetic losses includes core loss, stray load loss and pulse-width modulation (PWM) loss.

10. A computer readable storage device having a program of instructions, which when executed by a processor, causes the processor to execute:
    determining a resistance value for a loss compensation resistor, the resistance value representing a plurality of electro-magnetic losses of induction machine, the resistance value being determined from an inverse resistance value, where the inverse resistance value is determined by $$\frac{1}{R_c} = m_{rc}\omega_{slip} + b_{rc}, \text{ where } \frac{1}{R_c}$$

is the inverse resistance value, $m_{rc}$ is a speed based slope, $\omega_{slip}$ is a slim speed and $b_{rc}$ is a speed based offset;
    updating at least one control equation based on an equivalent circuit using the resistance value; and
    controlling the induction machine based on the updated at least one control equation.

* * * * *